(12) United States Patent
Winstead et al.

(10) Patent No.: US 7,479,422 B2
(45) Date of Patent: Jan. 20, 2009

(54) SEMICONDUCTOR DEVICE WITH STRESSORS AND METHOD THEREFOR

(75) Inventors: Brian A. Winstead, Austin, TX (US); Ted R. White, Austin, TX (US); Da Zhang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 176 days.

(21) Appl. No.: 11/373,536

(22) Filed: Mar. 10, 2006

(65) Prior Publication Data

US 2007/0210314 A1 Sep. 13, 2007

(51) Int. Cl.
*H01L 21/336* (2006.01)

(52) U.S. Cl. .................... 438/197; 438/222; 438/299; 257/E21.431; 257/E21.633; 257/E21.634

(58) Field of Classification Search ........... 257/E21.431
See application file for complete search history.

(56) References Cited

U.S. PATENT DOCUMENTS

| | | | |
|---|---|---|---|
| 6,429,061 B1 * | 8/2002 | Rim ................... | 257/E21.633 |
| 6,831,350 B1 * | 12/2004 | Liu et al. .................... | 438/197 |
| 6,838,728 B2 * | 1/2005 | Lochtefeld et al. .......... | 257/325 |
| 6,885,084 B2 | 4/2005 | Murthy et al. | |
| 6,887,762 B1 * | 5/2005 | Murthy et al. ....... | 257/E21.431 |
| 7,230,264 B2 * | 6/2007 | Thean et al. ......... | 257/E21.431 |
| 7,268,049 B2 * | 9/2007 | Zhu et al. ............ | 257/E21.431 |
| 7,288,448 B2 * | 10/2007 | Orlowski et al. ..... | 257/E21.431 |
| 2005/0242340 A1 * | 11/2005 | Chidambarrao et al. ....... | 257/19 |
| 2006/0205167 A1 * | 9/2006 | Kavalieros et al. .......... | 438/197 |

OTHER PUBLICATIONS

Welser et al; "NMOS and PMOS Transistors Fabricated in Strained Silicon/Relaxed Silicon-Germanium Structures"; IEDM 1992, pp. 1000-1002.

* cited by examiner

*Primary Examiner*—Zandra V. Smith
*Assistant Examiner*—Sun M Kim
(74) *Attorney, Agent, or Firm*—James L. Clingan, Jr.; Ranjeev K. Singh

(57) ABSTRACT

A method for forming a semiconductor device includes providing a substrate region having a first material and a second material overlying the first material, wherein the first material has a different lattice constant from a lattice constant of the second material. The method further includes etching a first opening on a first side of a gate and etching a second opening on a second side of the gate. The method further includes creating a first in-situ p-type doped epitaxial region in the first opening and the second opening, wherein the first in-situ doped epitaxial region is created using the second material. The method further includes creating a second in-situ n-type doped expitaxial region overlying the first in-situ p-type doped epitaxial region in the first opening and the second opening, wherein the second in-situ n-type doped epitaxial region is created using the second material.

7 Claims, 5 Drawing Sheets

SEMICONDUCTOR DEVICE WITH STRESSORS AND METHOD THEREFOR

FIELD OF THE INVENTION

This invention relates to semiconductor devices and more particularly to semiconductor devices with stressors.

BACKGROUND OF THE INVENTION

P and N channel transistors have been found to have improved performance by use of strained semiconductor material in the channel. N channel transistors benefit from more tensile stress, whereas P channel transistors benefit from compressive stress. A number of techniques have been proposed to achieve one or both of these stresses. One of the difficulties is enhancing the stress for both the N and P channel transistors. Another issue is achieving an enhancing stress while not introducing detrimental defects. Another issue is providing the optimum direction for the stress. For example, P channel transistors benefit more from an increase in compressive in the channel length direction than from an increase in compressive stress in both the channel length and channel width direction. Another issue is proper material choices for the P and N channel devices. N channel devices are generally better if they have a silicon channel rather than a germanium or silicon germanium (SiGe) channel because SiGe has lower electron mobility than silicon.

Thus, there is an need for a device that has the desired benefits that can be made in a process that improves on one or more of these issues.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect a device structure has an N channel transistor with a silicon channel and stressors as the source/drains that result in tensile stress in the channel and a P channel transistor with a silicon channel and stressors as the source/drains that result in compressive stress in the channel. The stressors, silicon for the N channel transistor and SiGe with increased germanium concentration for the P channel transistor, are epitaxially grown from a SiGe layer. This is better understood by reference to the drawings and the following description.

Figure 1:
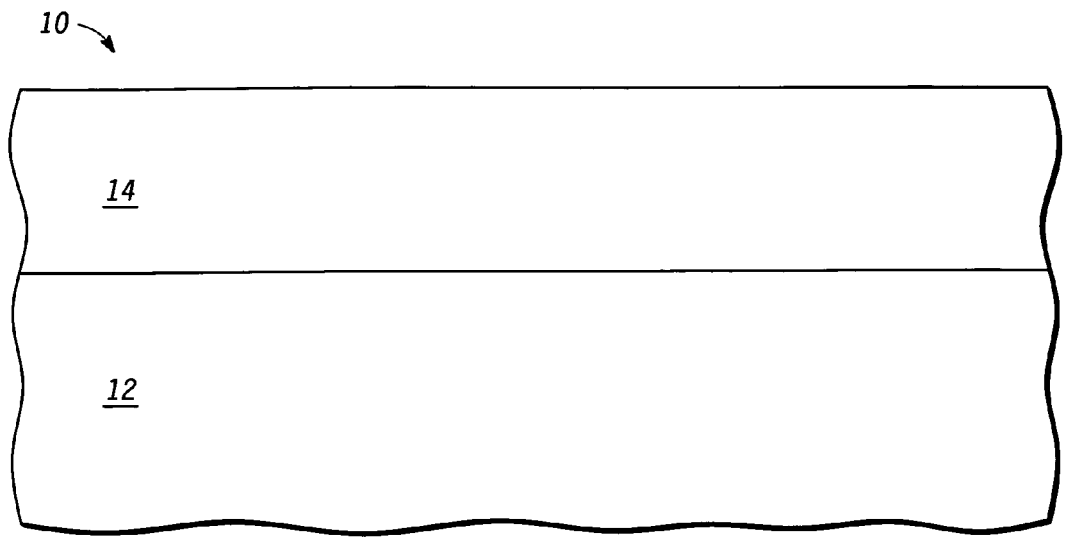
FIG. 1 is a cross section of a semiconductor device at a stage in a process that is according to an embodiment of the invention.

Shown in FIG. 1 is a semiconductor device structure 10 having a SiGe layer 12 and a silicon layer 14 on SiGe layer 12. SiGe layer 12 is relaxed and has a concentration of about 20% germanium. Silicon layer 14 is also relaxed and is preferably pure silicon. Under SiGe layer 12 is further structural support and in this case would preferably be an oxide layer and a relatively thick silicon layer. An alternative to this is to have a virtual silicon germanium substrate in which SiGe layer 12 is grown from an underlying silicon layer with a gradient in a manner that results in SiGe layer 12 having relaxed strain. The structure shown in FIG. 1 is believed to be unique in combining relaxed silicon and relaxed SiGe as two layers bonded together, but it can be made using known techniques. A wafer having a relaxed SiGe layer on its top face and another wafer having a relaxed silicon layer on its top face can be bonded together face to face so that the SiGe and silicon layers are bonded together. A subsequent cleaving of the silicon layer will result in device structure 10 of FIG. 1. A hydrogen implant along the line of cleaving is one way to assist in providing the cleaving to leave the desired thickness of the silicon layer. Another technique that could be used to provide a similar structure is to that of FIG. 1 is to provide an underlying relaxed SiGe layer, epitaxially growing a graded layer that ends in pure silicon, and then continuing to grow a pure silicon layer that would be relaxed. Epitaxially growing a relaxed a silicon layer on a SiGe layer is known to be achievable by reducing the concentration of germanium during the growth. The substrate material shown in FIG. 1 is based on a semiconductor wafer having a first semiconductor layer, SiGe layer 12, substantially consisting of silicon and germanium, wherein the first semiconductor layer has relaxed strain, and a second semiconductor layer on the first semiconductor layer substantially consisting of silicon, silicon layer 14, wherein the second semiconductor layer has relaxed strain.

Figure 2:
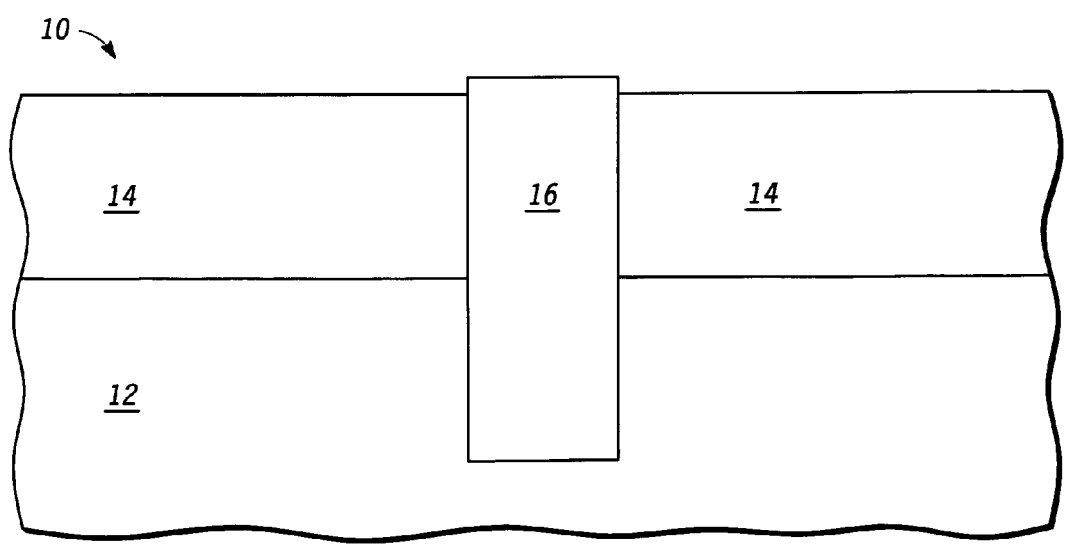
FIG. 2 is a cross section of the semiconductor device at a stage in the process subsequent to that shown in FIG. 1.

Shown in FIG. 2 is semiconductor device structure 10 after forming an isolation region 16 in silicon layer 14 and SiGe layer 12. Processes for forming isolation regions such as isolation region 16 are well known. Any such process should be satisfactory.

Figure 3:
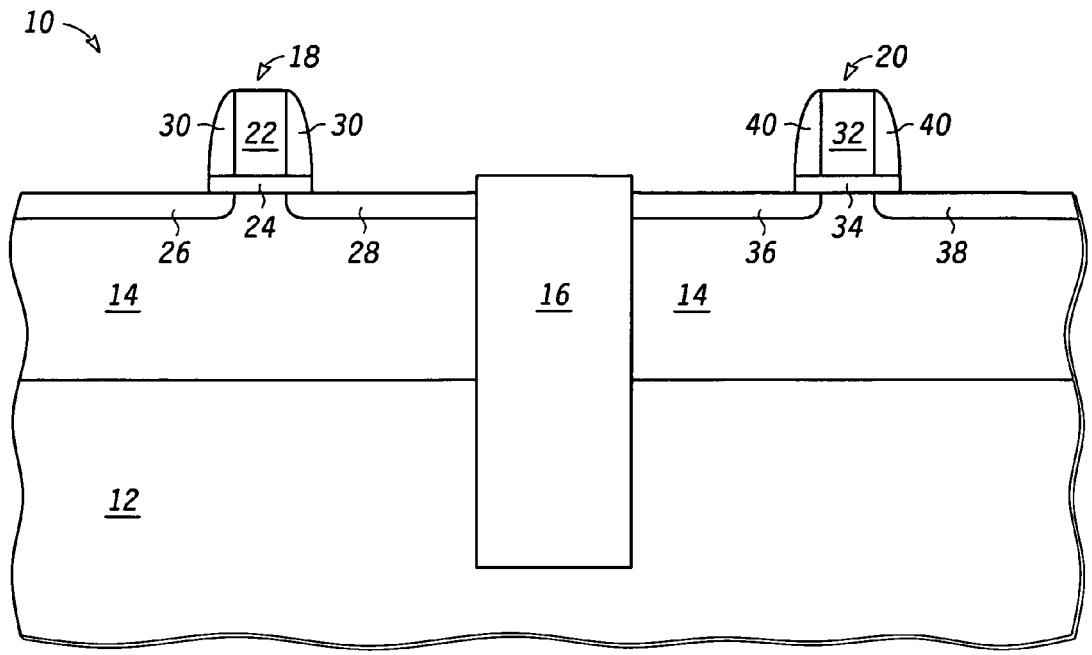
FIG. 3 is a cross section of the semiconductor device at a stage in the process subsequent to that shown in FIG. 2.

Shown in FIG. 3 is semiconductor device structure 10 after forming an N channel transistor 18 on one side of isolation region 16 and a P channel transistor 20 on the other side of isolation region 16. Prior to transistors 18 and 20 being formed, the side with transistor 18 is implanted with p-type dopants, preferably boron, to provide background doping, and the side with transistor 20 is implanted with n-type dopants, preferably phosphorus and/or arsenic, to provide background doping. Transistor 18 comprises a gate 22 over silicon layer 14, a gate dielectric 24 on silicon layer 14 and under gate 22, a source/drain extension 26 in silicon layer 14 on one side of gate 22, a source/drain extension 28 in silicon layer 14 on the other side of gate 22, and a sidewall spacer 30 around gate 22. Transistor 20 comprises a gate 32 over silicon layer 14, a gate dielectric 34 on silicon layer 14 and under gate 22, a source/drain extension 26 in silicon layer 14 on one side of gate 22 and a source/drain 30 extension 28 in silicon layer 14 on the other side of gate 22. Source/drain extensions 26, 28, 36, and 38 are preferably relatively shallow, about 500 Angstroms, but could be another depth. The doping concentrations for the background and the source/drain extensions are typical for those purposes.

Figure 4:
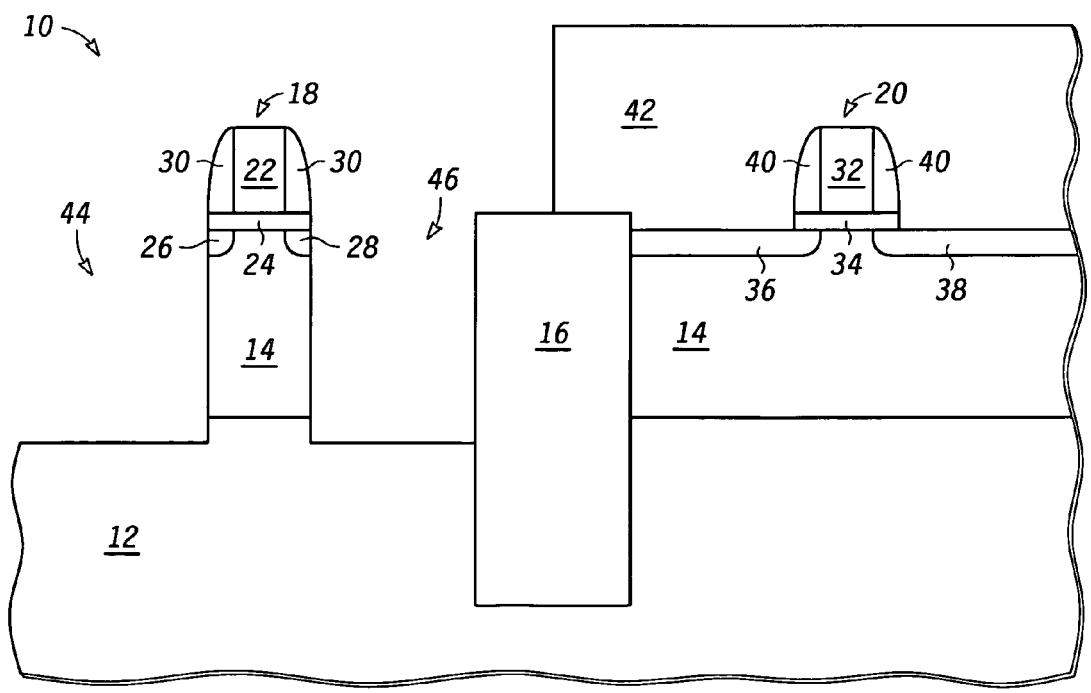
FIG. 4 is a cross section of the semiconductor device at a stage in the process subsequent to that shown in FIG. 3.

Shown in FIG. 4 is semiconductor device structure 10 after masking the side with transistor 20 with a hard mask 42 of oxide and etching openings 44 and 46 through silicon layer 14 and into SiGe layer 12 about 500 Angstroms. This etch uses gate 22 and sidewall spacer 30 as a mask so that openings 44 and 46 are on opposite sides of gate 22. The etch exposes SiGe layer 12 in openings 44 and 46. This leaves source/drain extensions 26 and 28 under sidewall spacer 30 and silicon layer 14 under gate 22 and sidewall spacer 30.

Figure 5:
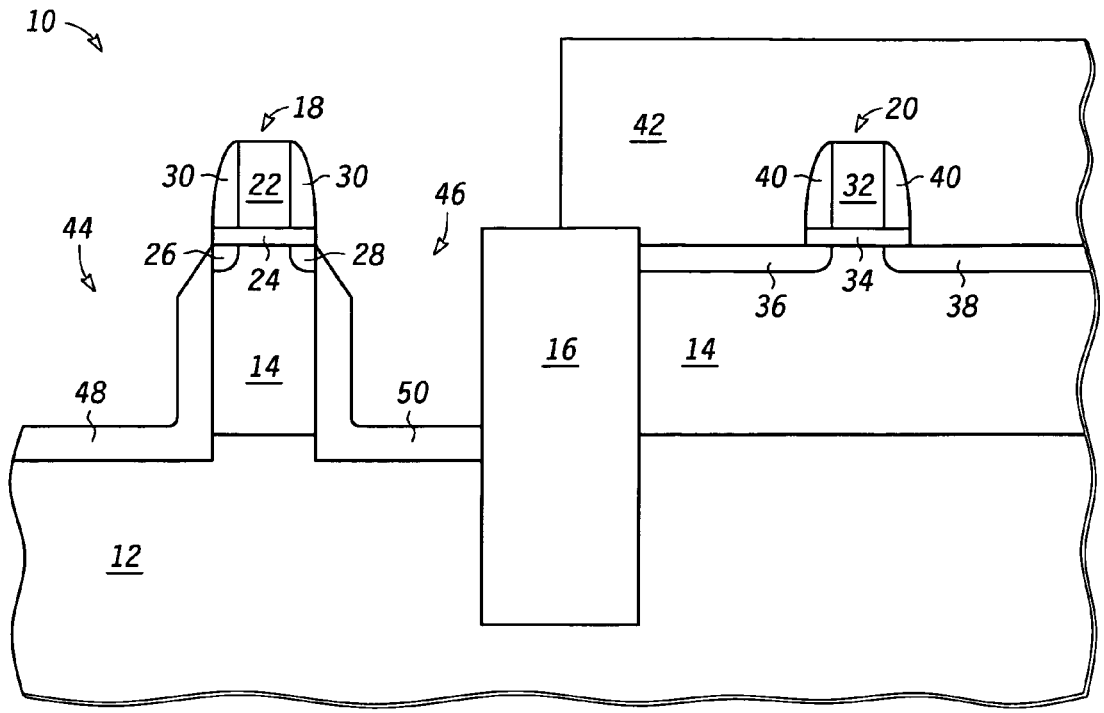
FIG. 5 is a cross section of the semiconductor device at a stage in the process subsequent to that shown in FIG. 4.

Shown in FIG. 5 is semiconductor device structure 10 after growing silicon layers of 48 and 50 epitaxially and in situ doped with p-type dopants, preferably boron, in openings 44 and 46, respectively. P-doped silicon layers 48 and 50 grow on the exposed surface of SiGe layer 12 and exposed sides of silicon layer 14. P-doped silicon layers follow the lattice from which they grow so that along silicon layer 14 it is relatively relaxed but along SiGe layer 12 it is tensile.

Figure 6:
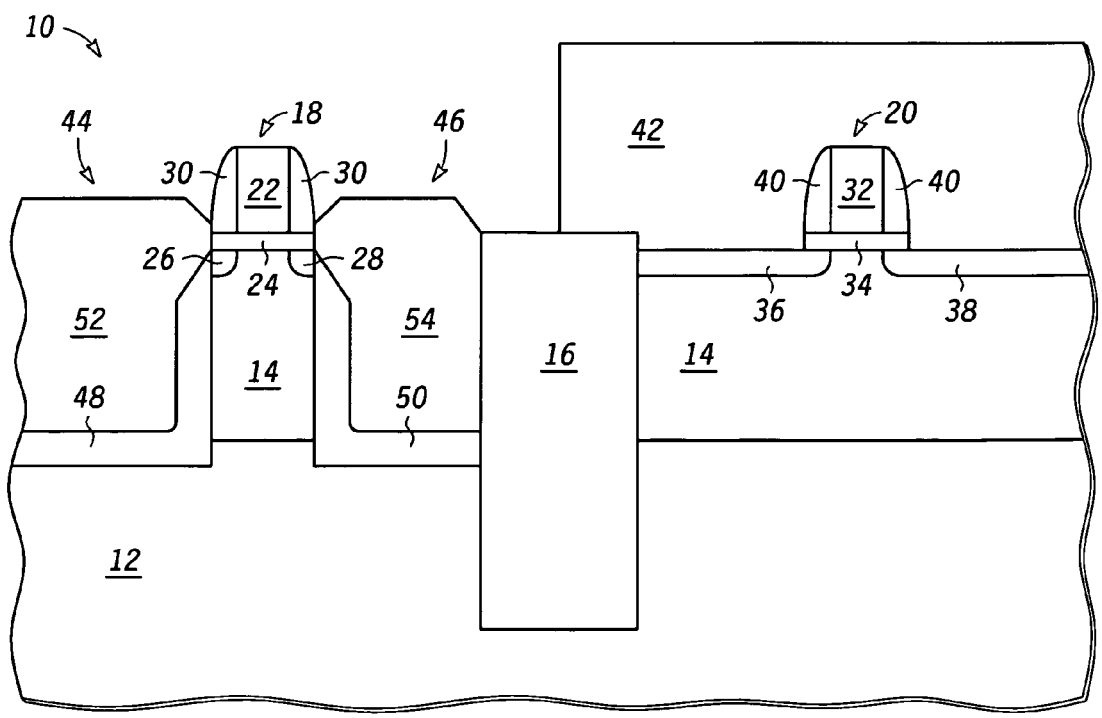
FIG. 6 is a cross section of the semiconductor device at a stage in the process subsequent to that shown in FIG. 5.

Shown in FIG. 6 is semiconductor device structure 10 after growing silicon layers of 52 and 54 epitaxially and in situ doped with n-type dopants, preferably arsenic and/or phosphorus, in openings 44 and 46, respectively. In this case the dopant concentration increases as the growth continues so that it is much more lightly doped at the interface with p-doped silicon layers 48 and 50 than at the top surface. The lattice structure of silicon layers 48, 50, 52, and 54 is tensile at a level that is between what it would be if it had the SiGe lattice structure of SiGe layer 12 and the relaxed condition of semiconductor layer 14. Silicon layers 48 and 52 function as one stressor for transistor 18, and layers 50 and 54 function as another stressor.

Figure 7:
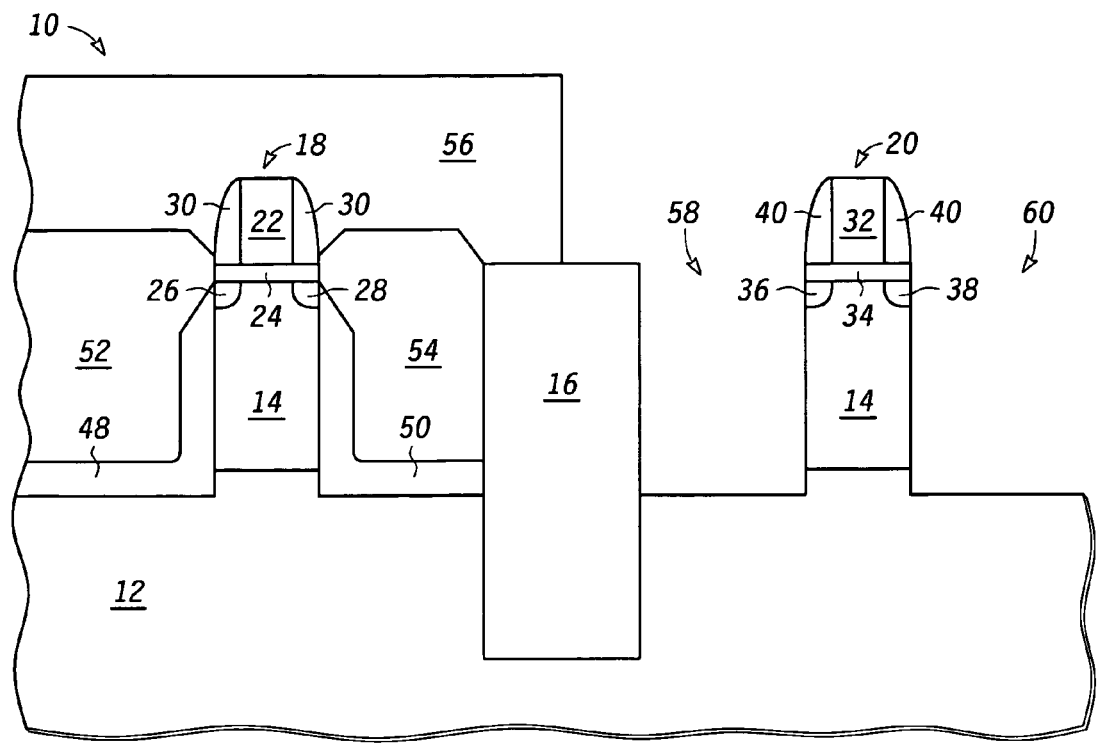
FIG. 7 is a cross section of the semiconductor device at a stage in the process subsequent to that shown in FIG. 6.

Shown in FIG. 7 is semiconductor device structure 10 after masking the side with transistor 18 with a hard mask 56 of oxide and etching openings 58 and 60 through silicon layer 14 and into SiGe layer 12 about 500 Angstroms. This etch uses gate 32 and sidewall spacer 40 as a mask so that openings 58 and 60 are on opposite sides of gate 32. The etch exposes SiGe layer 12 in openings 58 and 60. This leaves source/drain extensions 36 and 38 under sidewall spacer 40 and silicon layer 14 under gate 32 and sidewall spacer 40.

Figure 8:
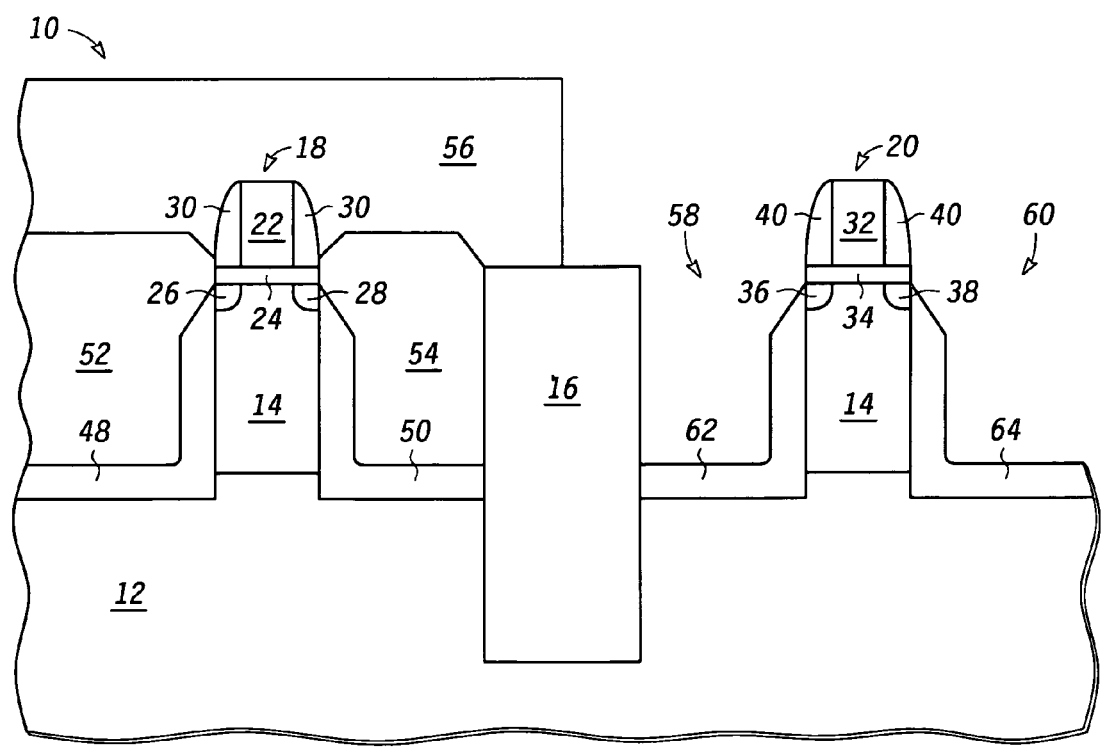
FIG. 8 is a cross section of the semiconductor device at a stage in the process subsequent to that shown in FIG. 7.

Shown in FIG. 8 is semiconductor device structure 10 after growing SiGe layers of 62 and 64 epitaxially and in situ doped with n-type dopants, preferably arsenic and/or phosphorus, in openings 58 and 60, respectively. Further, the germanium concentration of SiGe layers 62 and 64 is increased relative to the germanium concentration of SiGe layer 12. N-doped SiGe layers 62 and 64 grow on the exposed surface of SiGe layer 12 and exposed sides of silicon layer 14 and follow the lattice from which they grow. Thus, the portions along SiGe layer 12 are compressive laterally in the direction of current flow of transistor 20 (channel length direction), which is the primary direction of interest. The SiGe growth on the sides of semiconductor layer 14 is also a compressive but minimally so in the channel length direction.

Figure 9:
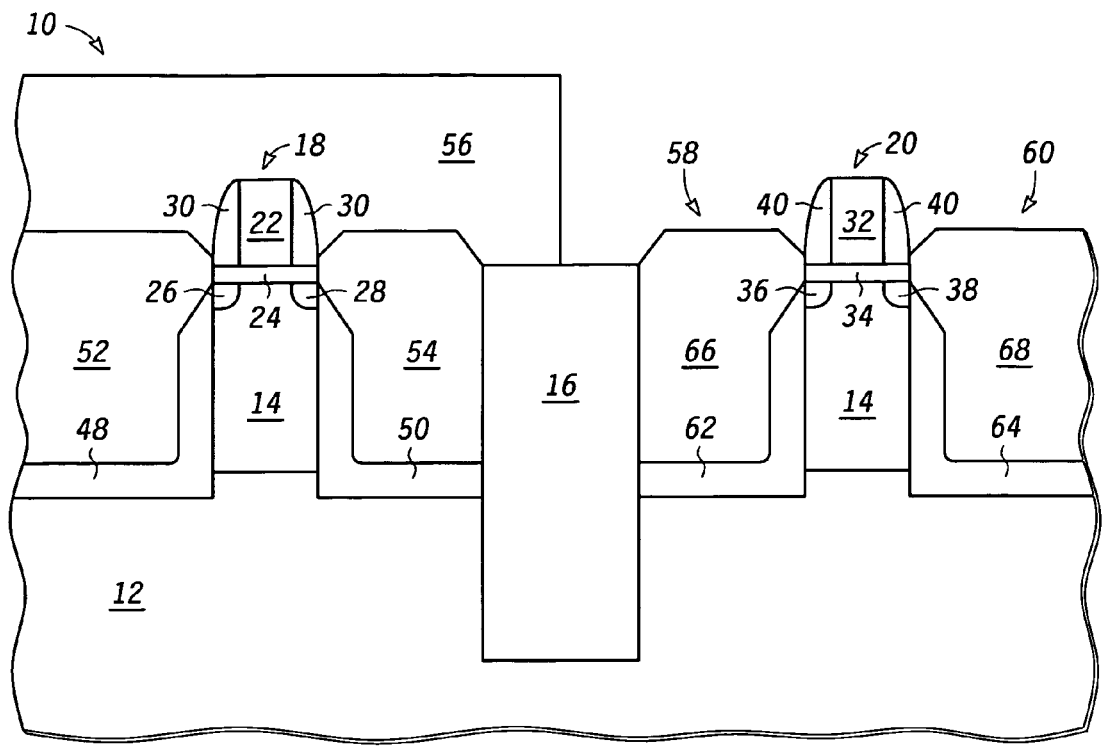
FIG. 9 is a cross section of the semiconductor device at a stage in the process subsequent to that shown in FIG. 8.

Shown in FIG. 9 is semiconductor device structure 10 after growing SiGe layers of 66 and 68 epitaxially and in situ doped with p-type dopants, preferably boron, in openings 58 and 60, respectively. In this case the dopant concentration increases as the growth continues so that it is much more lightly doped at the interface with n-doped SiGe layers 62 and 64 than at the top surface. In this example, SiGe 12 layer preferably has a geranium concentration of about 20 percent and the concentration of the grown SiGe layers 62, 64, 66, and 68 are about 40 percent geranium. The lattice structure of SiGe layers 62, 64, 66, and 68 is compressive. SiGe layers 62 and 66 function as one stressor for transistor 20, and layers 64 and 68 function as another stressor.

Figure 10:
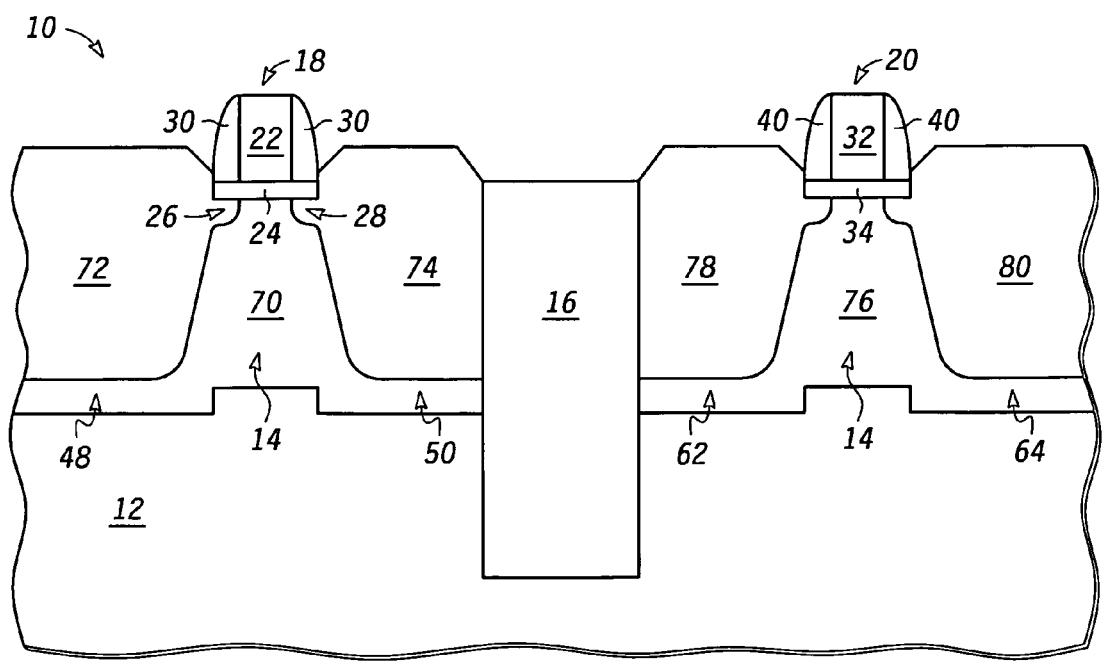
FIG. 10 is a cross section of the semiconductor device at a stage in the process subsequent to that shown in FIG. 9.

Shown in FIG. 10 is semiconductor device structure 10 after performing an anneal that causes the dopants to move somewhat resulting in a P doped region 70 substantially in areas where silicon layer 14 and silicon layers 48 and 50 were present. The anneal also results in an N-doped regions 72 and 74 substantially where silicon regions 52 and 54 and source/drain extensions 26 and 28 were. The doping concentration is higher away from the channel than adjacent to the channel, the region between N-doped regions 72 and 74 immediately under gate dielectric 24. The anneal further results in an N doped region 76 substantially in areas where silicon layer 14 and silicon layers 62 and 64 were present. In addition the anneal results in an P-doped regions 78 and 80 substantially where SiGe layers 62 and 64 and source/drain extensions 36 and 38 were. The doping concentration is higher away from the channel than adjacent to the channel, the region between P-doped regions 78 and 80 immediately under gate dielectric 34.

P channel region 70 ensures the presence of a PN junction between the source/drain regions, N doped regions 72 and 74, and the interface between silicon layer 14 and SiGe layer 12. This interface, both on the side having transistor 18 and the side having transistor 20, has many defects including at the corners of the interface. It is beneficial that these defects, including the ones in the corners, not interfere with source/drain operation which is achieved by virtue of the growth of N-doped layers 62 and 64 and P-doped layers 48 and 50. In addition to resulting in the beneficial compressive stress on the channel of the P channel transistor and the beneficial tensile stress on the channel of the N channel transistor, this approach also results in a silicon channel for the N channel transistor, which is the preferred material for N channel transistors.

Various other changes and modifications to the embodiments herein chosen for purposes of illustration will readily occur to those skilled in the art. For example, the isolation regions were described as using an existing process, but the isolation regions could be made using a process that is subsequently developed. In come cases particular thicknesses were described but other thicknesses may be beneficial. To the extent that such modifications and variations do not depart from the spirit of the invention, they are intended to be included within the scope thereof which is assessed only by a fair interpretation of the following claims.

The invention claimed is:

1. A method for forming a semiconductor device, comprising:
   providing a substrate region having a first material and a second material overlying the first material, wherein the first material has a different lattice constant from a lattice constant of the second material;
   forming a gate in the substrate region having the second material;
   etching a first opening on a first side of the gate and etching a second opening on a second side of the gate, wherein each of the first opening and the second opening extends into the substrate region having the first material;
   creating a first in-situ doped epitaxial region in the first opening and the second opening, wherein the first in-situ doped epitaxial region is created using silicon and has a first doping type; and
   creating a second in-situ doped expitaxial region overlying the first in-situ doped epitaxial region in the first opening and the second opening, wherein the second in-situ doped epitaxial region is created using silicon and has a second doping type different from the first doping type;

wherein the first material is relaxed silicon germanium and the second material is relaxed silicon.

2. The method of claim 1 further comprising forming a source/drain region in the substrate region comprising silicon.

3. The method of claim 2, wherein a plurality of defects exist at a junction of the substrate region having the first material and the substrate region having the second material and wherein the first in-situ doped expitaxial region electrically isolates the plurality of defects from the source/drain region.

4. The method of claim 1, wherein the first doping type is p-type and the second doping type is n-type.

5. The method of claim 1, wherein the step of creating the second in-situ doped expitaxial region is further characterized by the second in-situ doped expitaxial region having a doping concentration that increases from an interface with the first in-situ doped epitaxial layer to a top surface of the second in-situ doped expitaxial region.

6. The method of claim 1, wherein providing the substrate region comprises bonding a layer of the first material to a layer of the second material.

7. The method of claim 1, wherein the lattice constant of the second material is lower than a lattice constant of the first material.

* * * * *